United States Patent
Inoue (10) Patent No.: US 10,115,560 B2
(45) Date of Patent: Oct. 30, 2018

(54) APPARATUS FOR MODIFYING SURFACES OF TITANIUM IMPLANTS MADE OF TITANIUM ALLOY

(71) Applicant: Sodick Co., Ltd., Kanagawa (JP)

(72) Inventor: Motohiro Inoue, Kanagawa (JP)

(73) Assignee: Sodick Co., Ltd., Kanagawa (JP)

( * ) Notice: Subject to any disclaimer, the term of this patent is extended or adjusted under 35 U.S.C. 154(b) by 36 days.

(21) Appl. No.: 15/592,198

(22) Filed: May 11, 2017

(65) Prior Publication Data

US 2017/0358423 A1 Dec. 14, 2017

(30) Foreign Application Priority Data

Jun. 8, 2016 (JP) .................................. 2016-114633

(51) Int. Cl.
*H01J 37/20* (2006.01)
*H01J 37/30* (2006.01)
*H01J 37/18* (2006.01)

(52) U.S. Cl.
CPC ........ *H01J 37/3002* (2013.01); *H01J 37/185* (2013.01); *H01J 37/20* (2013.01)

(58) Field of Classification Search
CPC ....... H01J 37/3002; H01J 37/185; H01J 37/20
USPC ... 250/440.11, 441.11, 442.11, 443.1, 492.1, 250/492.2, 492.3
See application file for complete search history.

(56) References Cited

U.S. PATENT DOCUMENTS

| | | | | |
|---|---|---|---|---|
| 5,091,217 A | * | 2/1992 | Hey | ...................... C23C 16/455 118/719 |
| 2002/0021959 A1 | * | 2/2002 | Schauer | ................. B23Q 3/186 414/744.2 |
| 2002/0043337 A1 | * | 4/2002 | Goodman | ........... C23C 16/4581 156/345.12 |
| 2009/0194238 A1 | * | 8/2009 | Ishibashi | ........... H01L 21/68728 156/345.52 |
| 2011/0181852 A1 | * | 7/2011 | Bleidistel | ............. G02B 7/1827 355/30 |
| 2017/0117172 A1 | * | 4/2017 | Genetti | ............. H01L 21/67742 |

FOREIGN PATENT DOCUMENTS

| JP | 2002535109 | 10/2002 |
|---|---|---|
| JP | 2003111778 | 4/2003 |
| JP | 2011510810 | 4/2011 |

* cited by examiner

*Primary Examiner* — Nicole Ippolito
(74) *Attorney, Agent, or Firm* — JCIPRNET (57) ABSTRACT

A metal surface modification apparatus having a tilting unit includes holding jigs having respective lower parts having curved surfaces to hold the implants; a movable holding base provided with a plurality of receiving depressions to have curved surfaces corresponding to the curved surfaces of the lower parts; and a stationary pushing plate disposed on the movable holding base to cover the movable holding base, and configured to be moved relative to the movable holding base and to have a plurality of through holes positioned to face the receiving depressions.

1 Claim, 5 Drawing Sheets

APPARATUS FOR MODIFYING SURFACES OF TITANIUM IMPLANTS MADE OF TITANIUM ALLOY

CROSS-REFERENCE TO RELATED APPLICATION

This application claims the priority benefit of Japan application serial no. 2016-114633, filed on Jun. 8, 2016. The entirety of the above-mentioned patent application is hereby incorporated by reference herein and made a part of this specification.

BACKGROUND

1. Technical Field

The present invention relates generally to a metal surface modification apparatus for modifying metal surfaces by radiating electron beams onto the metal surfaces, and more particularly to a metal surface modification apparatus for modifying the surfaces of titanium implants made of a titanium alloy.

2. Description of the Related Art

Titanium is a light metal having a specific density of 4.5, and is relatively lightweight. In particular, titanium is a stable metal having high corrosion resistance. Titanium is not easily dissolved in the human body due to its difficulty in reacting with a biological material. Furthermore, the amount of titanium absorbed into the human body is extremely small because it is not an essential biological element, and titanium has low toxicity. Accordingly, titanium and titanium alloys are widely used as materials for medical appliances. Examples of biocompatible titanium alloys include: TiNi, Ti-6Al-4V, Ti-6Al-7Nb, and Ti—Nb—Sn. Although titanium usually contains a predetermined or less quantity of impurities, both titanium and a titanium alloy will be simply referred to as "titanium" in the following description.

Titanium is, however, corroded by fluoride. When titanium is used as a material for dental implants, there is the concern that titanium may be absorbed into the human body because toothpaste contains fluoride. Although titanium is known as having extremely low toxicity, titanium implants are generally subjected to surface treatment for the formation of a coating in order to further improve corrosion resistance. For this reason, titanium is still suitable for a material of dental implants that require high corrosion resistance and high abrasion resistance.

Processes for treating the surface of a titanium implant may be mainly classified into a process of treating the surface of a titanium implant in an aqueous solution, and a process of treating the surface of a titanium implant in a vacuum or air. The process of treating the surface of a titanium implant in an aqueous solution has advantages in that required equipment has a relatively simple configuration and it is possible to treat the surface of an implant having a complex shape. In contrast, the process of treating the surface of a titanium implant in a vacuum or air has advantages in that it is possible to perform surface treatment without using chemical agents and it is possible to form a thinner coating.

In the case of the process of performing surface treatment in an aqueous solution, there is a case where chemical agents used in the process remain on an implant, and thus there is a need to consider that there is the concern that chemical agents are gradually dissolved in the human body during long-term use. Furthermore, in order to make the surface of a molded titanium product smooth like the surface of a mirror, it is required to mechanically polish the surface to a certain finished surface roughness. As the thickness of a coating obtained by the surface treatment becomes thinner, a rough surface caused by mechanical processing is more likely to remain on the surface of an implant after surface treatment. For this reason, a treated person is likely to feel pain.

Examples of a process of modifying the surface of a titanium artificial tooth or implant by using electron beams are disclosed, for example, in patent documents 1 to 3. The surface modification process using electron beams does not use chemical agents. Furthermore, the surface modification process using electron beams is designed to convert the surface layer of a metal into a microcrystalline structure by using a physical principle, and can provide a thin modified layer having higher corrosion resistance, higher abrasion resistance and higher endurance than a coating layer. Moreover, this process has an advantage of obtaining a smooth surface, which cannot be obtained by mechanical processing. In particular, when electron beams having low-density energy are radiated onto a relatively large area, it is possible to obtain an extremely thin modified layer with less non-uniform irradiation.

PRIOR ART DOCUMENTS

Patent Documents

[Patent document 1] Japanese Unexamined Patent Application Publication No. 2003-111778

[Patent document 2] Japanese Unexamined Patent Application Publication No. 2011-510810

[Patent document 3] Japanese Unexamined Patent Application Publication No. 2002-535109

SUMMARY

In the case of the surface modification using electron beams, it is difficult to uniformly radiate electron beams onto the overall surface of an implant. Furthermore, it is difficult to radiate electron repeatedly onto a plurality of implants with concurrently and uniformly energy. Moreover, improvement in operation efficiency is required. In particular, when electron beams having a relatively small diameter of beam column and high energy density are radiated onto implants, there is the possibility that the thickness of a modified layer reaches 10 μm or more, and thus there is the concern that the original shapes of the implants are deformed to an unacceptable extent due to damage to edges of the implants.

In view of the above-described problems, an object of the present invention is to provide an improved metal surface modification apparatus that is capable of concurrently and uniformly modifying the surfaces of a plurality of titanium implants and continuously radiating electron beams onto the overall surfaces of the individual implants. The advantages that can be achieved by the present invention will be described in detail in the following description of an embodiment of the present invention.

According to an aspect of the present invention, there is provided a metal surface modification apparatus for modifying the surfaces of titanium implants made of a titanium alloy, the metal surface modification apparatus including: a vacuum chamber configured to accommodate implants in a vacuum environment; a transfer unit disposed within the vacuum chamber, and configured to move the implants at least in a first horizontal uniaxial direction and in a second horizontal uniaxial direction perpendicular to the first horizontal uniaxial direction; a table disposed on the transfer unit, and configured such that the implants are placed thereon; an electron gun including a cathode electrode, an annular anode electrode configured to generate plasma, and a solenoid configured to generate a magnetic field; and a tilting unit configured to tilt the implants to a predetermined angle as the transfer unit moves the implants. The tilting unit includes: holding jigs configured to have respective lower parts having curved surfaces, respectively, and to hold the implants, respectively; a movable holding base fastened onto the table, and configured to have a plurality of receiving depressions famed through an upper surface thereof to have curved surfaces corresponding to the curved surfaces of the lower parts of the holding jigs; and a stationary pushing plate disposed on the movable holding base to cover the movable holding base, and configured to be moved relative to the movable holding base and to have a plurality of through holes positioned to face the receiving depressions.

As described above, the metal surface modification apparatus according to the present invention includes the electron gun configured to radiate electron beams having low-density energy onto a relatively large area, the transfer unit configured to move implants, and the tilting unit configured to concurrently tilt a plurality of implants to a predetermined angle in a certain direction. Accordingly, it is possible to almost uniformly radiate electron beams having low-density energy onto a plurality of implants at one time and repeatedly and continuously radiate electron beams onto the overall surfaces of the implants. As a result, it is possible to manufacture high-quality implants more easily and efficiently.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
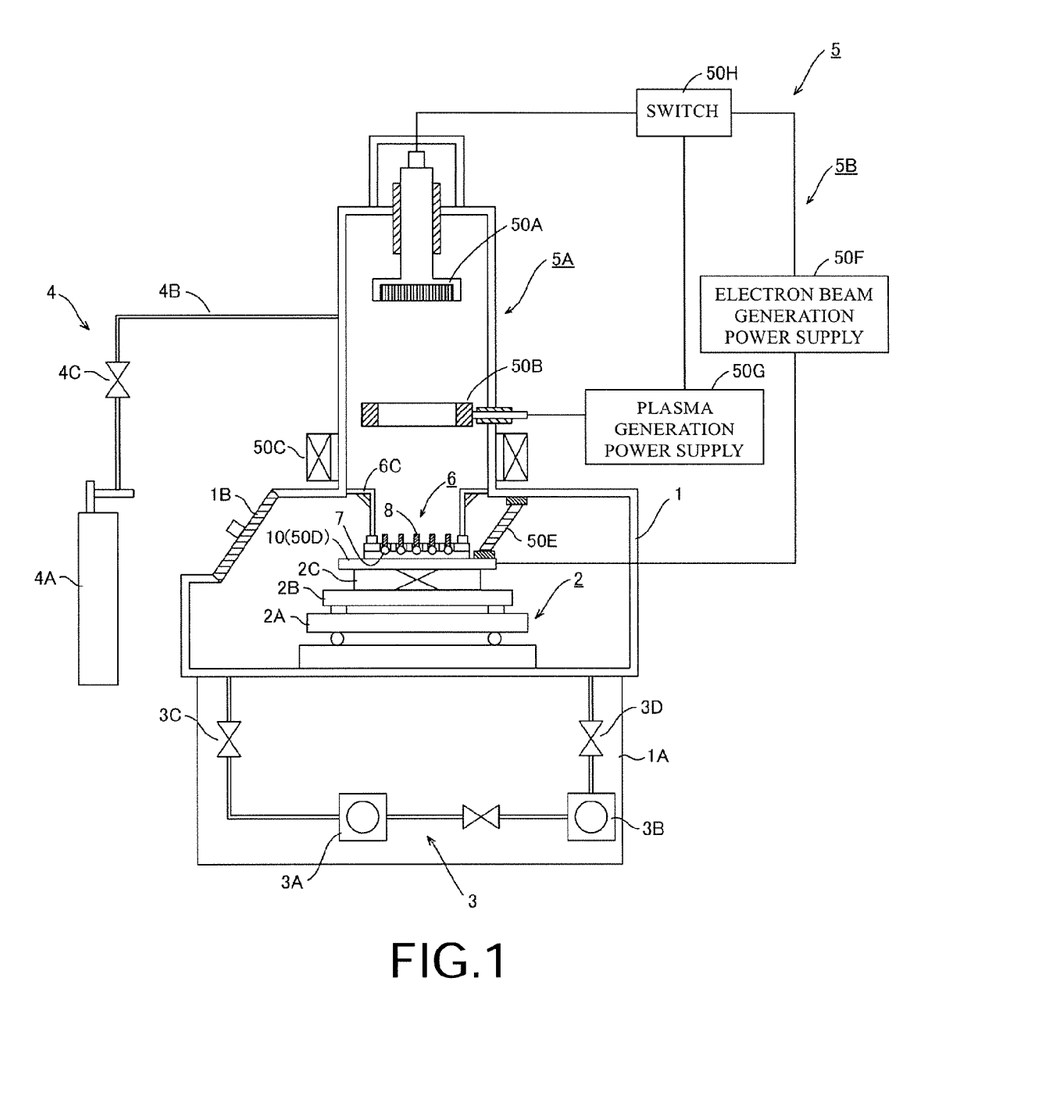
FIG. 1 is a side view showing the schematic configuration of a metal surface modification apparatus according to the present invention.

FIG. 1 shows a metal surface modification apparatus according to an embodiment of the present invention. The metal surface modification apparatus according to the present embodiment includes a vacuum chamber 1, a transfer unit 2, a vacuum unit 3, a noble gas supply unit 4, an electron beam generation unit 5, and a tilting unit 6. The tilting unit 6 substantially includes holding jigs 7. Objects onto which electron beams are to be radiated are dental implants 8 made of titanium. Furthermore, the metal surface modification apparatus according to the present embodiment includes a purification unit (not shown) that is capable of forcibly discharging contaminated gas from the vacuum chamber 1 that contains residues generated from the surfaces of the implants 8.

The vacuum chamber 1 is a means for accommodating the implants 8 in a vacuum environment. As used herein, the term "vacuum" refers to a state at a pressure equal to or lower than 0.1 Pa, which is close to an ideal vacuum state. In FIG. 1, the vacuum chamber 1 is shown in a section view. The vacuum chamber 1 is placed on a base 1A. The vacuum chamber 1 has an opening that is formed through the front surface of the metal surface modification apparatus in order to allow the implants 8 to be put into or taken out of the apparatus through the opening. The vacuum chamber 1 is equipped with a sealed door 1B configured to close the opening. The vacuum chamber 1 is designed to be able to maintain air pressure in a vacuum state within a range from 0.03 Pa to 0.1 Pa.

The transfer unit 2 is a means for transferring the implants 8 in a first horizontal uniaxial direction, a second horizontal uniaxial direction perpendicular to the first horizontal uniaxial direction, and a vertical direction. The transfer unit 2 includes a first movable body 2A configured to reciprocate in the first uniaxial direction, a second movable body 2A configured to reciprocate in the second uniaxial direction perpendicular to the first uniaxial direction, a lifting unit 2C configured to reciprocate in a vertical direction, and a driving unit configured to include a motor (not shown). A table 10 configured to function as a mounting base on which the implants 8 are placed is disposed on the lifting unit 2C.

The vacuum unit 3 is a means for reducing internal pressure in the sealed vacuum chamber 1 to a predetermined air pressure in order to cause the internal pressure to become close to vacuum. The vacuum unit 3 performs so-called "vacuum drawing" adapted to discharge air from the vacuum chamber 1 by means of a vacuum pump. The vacuum pump includes a first pump 3A composed of a scroll pump or a rotary pump, and a second pump 3B composed of a turbo-molecular pump or an oil-diffusion pump. After the internal pressure has been reduced to the predetermined air pressure, a flow control valve 3C and a flow control valve 3D are closed. The vacuum pump 3 is operated during the radiation of electron beams, and the discharging of air from the vacuum chamber 1 continues in order to maintain the reduced pressure in the vacuum chamber 1.

The noble gas supply unit 4 is a means for supplying noble gas into the vacuum chamber 1. As used herein, the term "noble gas" refers to helium, neon, argon, krypton, xenon, or furan, which is an element of Group 18 in the long periodic table. In the metal surface modification apparatus according to the present embodiment, the noble gas supply unit 4 supplies argon gas. Argon gas functions to promote the generation of plasma. The noble gas supply unit 4 includes a bomb 4A configured to contain liquefied argon under a sealed condition, a pipe 4B configured to connect the vacuum chamber 1 to the bomb 4A, and a valve 4C configured to selectively open and close the bomb 4A.

In the present embodiment, gas, such as noble gas and nitrogen gas having low chemical reactivity, may be referred to as inert gas. In the metal surface modification apparatus according to the present embodiment, nitrogen gas is used to expel argon gas, contaminated due to the radiation of electron beams, from the vacuum chamber 1 in order to normalize the inside of the vacuum chamber 1.

The electron beam generation unit 5 includes an electron gun 5A, and a power supply unit 5B. The electron gun 5A of the electron beam generation unit 5 according to the present embodiment includes a cathode electrode 50A, an annular anode electrode 5B, and a solenoid 50C configured to generate a magnetic field. A collector 50D configured to conduct electricity to the implant 8 is substantially the table 10. The table 10 is grounded to the vacuum chamber 1 via a ground line 50E.

The power supply unit 5B of the electron beam generation unit 5 according to the present embodiment includes an electron beam generation power supply 50F, a plasma generation power supply 50G, and a switch 50H. The electron beam generation power supply 50F includes a high-voltage power supply configured to apply voltage pulses required for the generation of electron beams between the cathode electrode 50A and the implants 8 electrically connected to the table 10. The plasma generation power supply 50G is provided between the cathode electrode 50A and the anode electrode 50B in order to supply voltage required for the generation of plasma in the annular ring of the anode electrode 50B. The switch 50H functions to selectively allow and shut off the supply of power to the cathode electrode 50A and the anode electrode 50B.

The cathode electrode 50A includes a base plate configured to have a circular section with a predetermined sectional area, and a plurality of acicular protrusions made of titanium. The cathode electrode 50A having a relatively large sectional area may generate an electron beam bundle having a large diameter and smaller energy density. Accordingly, even a single performance of radiation enables electron beams to uniformly collide with larger surfaces of the implants 8, and enables the surface modification of the implants 8 to be performed up to an extremely small depth, which is about several μm away from the surface.

The cathode electrode 50A is fastened to an upper side of the inside of the sealed vacuum chamber 1. A gap switch for a cathode is provided in the sealed space above the cathode electrode 50A. The cathode electrode 50A is spaced apart from the implants 8 placed on the table 10 by a predetermined distance that is determined such that electrons collide with the surfaces of the implants 8 at such a speed as not to damage the implants 8 and thus modify the surfaces of the implants 8. The metal surface modification apparatus according to the present embodiment may linearly and uniformly radiate an electron beam column having a large sectional area in the direction of gravity.

The anode electrode 50B is configured to have a ring shape having a large inner diameter that is larger than the sectional diameter of the cathode electrode 50A. In the metal surface modification apparatus according to the present embodiment, when the diameter of the cathode electrode 50A is 60 mmϕ, the inner diameter of the anode electrode 50B is 210 mmϕ. The anode electrode 50B generates, within the circular ring thereof, plasma that has a relatively short lifespan. The ionization layer of the plasma converges electrons that are emitted from the cathode electrode 50A.

Figure 4:
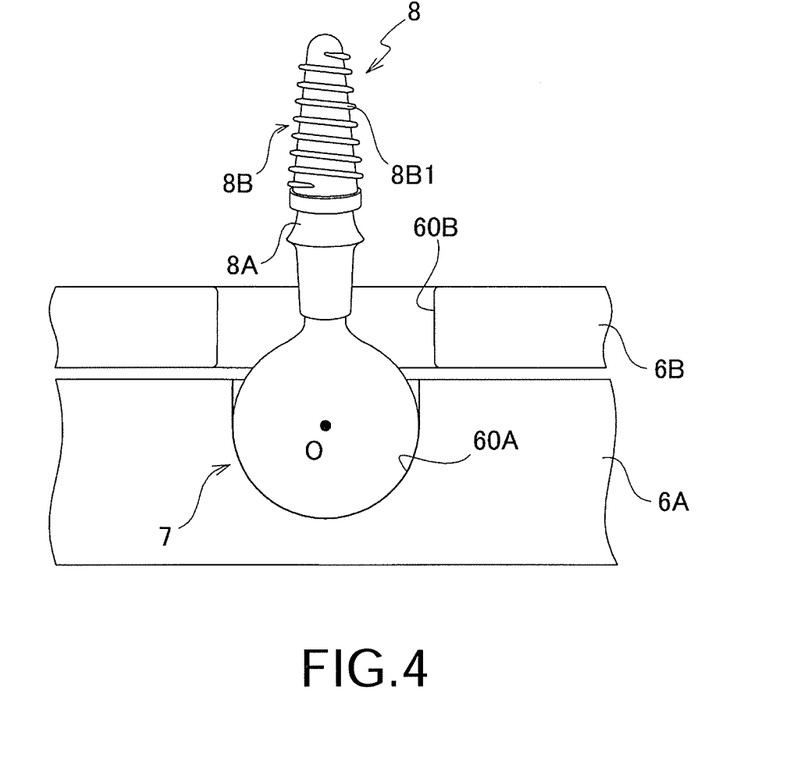
FIG. 4 is an enlarged side sectional view showing a portion of the holding jig before the radiation of an electron beam.

In the present embodiment, electrons emitted from the electron gun 5A are accelerated between the cathode electrode 50A and the anode electrode 50B, and thus reach an extremely high speed. Therefore, the influence of a magnetic field from the solenoid 50C on electrons is negligible, and the accelerated electrons are driven into the implants 8 at an angle that is slightly inclined with respect to a vertical downward direction. Accordingly, when an electron beam is radiated onto an implant 8 that is positioned such that the axial direction of the implant 8 coincides with the vertical direction, as shown in FIG. 4, a problem arises in that electrons are not radiated onto shaded portions, such as the lower portions of thread crests 8B1, and thus the surface modification of the implant 8 is not desirably performed.

For this reason, the present embodiment is configured to freely tilt the axes of a plurality of implants 8 by means of the tilting unit 6 in order to radiate electron beams onto the overall surfaces of the implants 8. The tilting unit 6 is now described in detail with reference to FIGS. 1 to 4.

Figure 2:
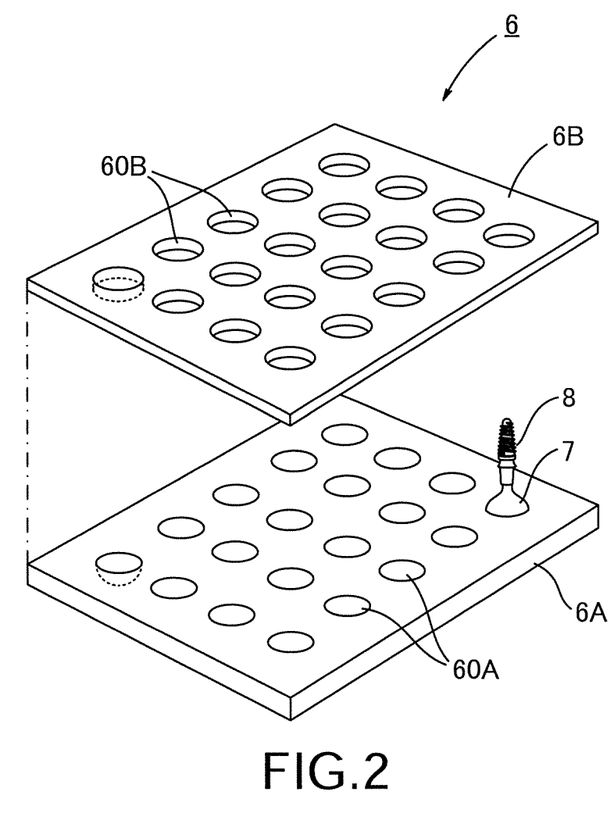
FIG. 2 is a perspective view showing the tilting unit of the metal surface modification apparatus according to the present invention.

The tilting unit 6 is a means for mounting the implants 8 such that the individual implants 8 are tilted to a predetermined angle in a certain direction while being moved by the transfer unit 2. The tilting unit 6 is placed on the table 10. The tilting unit 6 includes a movable holding base 6A and a stationary pushing plate 6B. In a broad sense, the tilting unit 6 includes holding jigs 7, which are auxiliary components. Both the movable holding base 6A and the stationary pushing plate 6B are made of non-magnetic material. Specifically, in the tilting unit 6 according to the present embodiment, the movable holding base 6A and the stationary pushing plate 6 are made of stainless steel (SUS 304). The tilting unit 6 conducts electricity to the implants 8.

The movable holding base 6A horizontally moves the implants 8 held on the holding jigs 7. The movable holding base 6A is securely mounted on the table 10 by means of a plurality of fastening bolts (not shown). Accordingly, when the table 10 is moved horizontally by the movement of the first and second movable bodies 2A and 2B of the transfer unit 2, the movable holding base 6A is moved by the same distance in the same direction as the table 10.

The stationary pushing plate 6B is held in the vacuum chamber 1 in a suspended state by means of a bracket 6C. The stationary pushing plate 6B is disposed directly on the horizontally movable holding base 6A in such a manner as to overlap the movable holding base 6A and be movable relative to the movable holding base 6A. The stationary pushing plate 6B is in contact with the movable holding base 6A so that the movable holding base 6A is slidable relative to the stationary pushing plate 6B. However, the movable holding base 6A and the stationary pushing plate 6B may be completely separated from each other.

As shown in FIG. 2, the movable holding base 6A is provided, on the upper surface thereof, with a plurality of receiving depressions 60A configured to have curved surfaces corresponding to the curved surfaces of the lower parts of the holding jigs 7. The plurality of receiving depressions 60A is formed in the movable holding base 6A at regular intervals. The maximum number of receiving depressions 60A is dependent upon the radiation area of electron beams in order to uniformly radiate the electron beams onto the implants 8. In other words, the number of implants 8 that can be surface-modified at one time is determined by the sizes of the cathode electrode 50A and the anode electrode 50B.

A plurality of through holes 60B is formed in the stationary pushing plate 6B at regular intervals to be respectively positioned at the locations of the plurality of receiving depressions 60A of the movable holding base 6A. When the movable holding base 6A is moved horizontally in a certain direction, the stationary pushing plate 6B pushes portions of the holding jigs 7 above the centers O of the holding jigs 7 shown in FIG. 4 in the direction opposite a direction in which the implants 8 are moved, thereby tilting the implants 8 by a predetermined angle.

The diameter of the through holes 60B is determined by considering the thickness of the stationary pushing plate 6B in such a manner that the implants 8 can be tilted to a required maximum angle without interference with the stationary pushing plate 60B. When the movable holding base 6A is moved, portions of the inner surfaces of the through holes 60B of the stationary pushing plate 6B come into contact with the holding jigs 7. Meanwhile, when the holding jigs 7 are tilted to the maximum angle, the opposite portions of the inner surfaces of the through holes 60B of the stationary pushing plate 6B come into contact with either the tilted holding jigs 7 or the implants 8.

Figure 3:
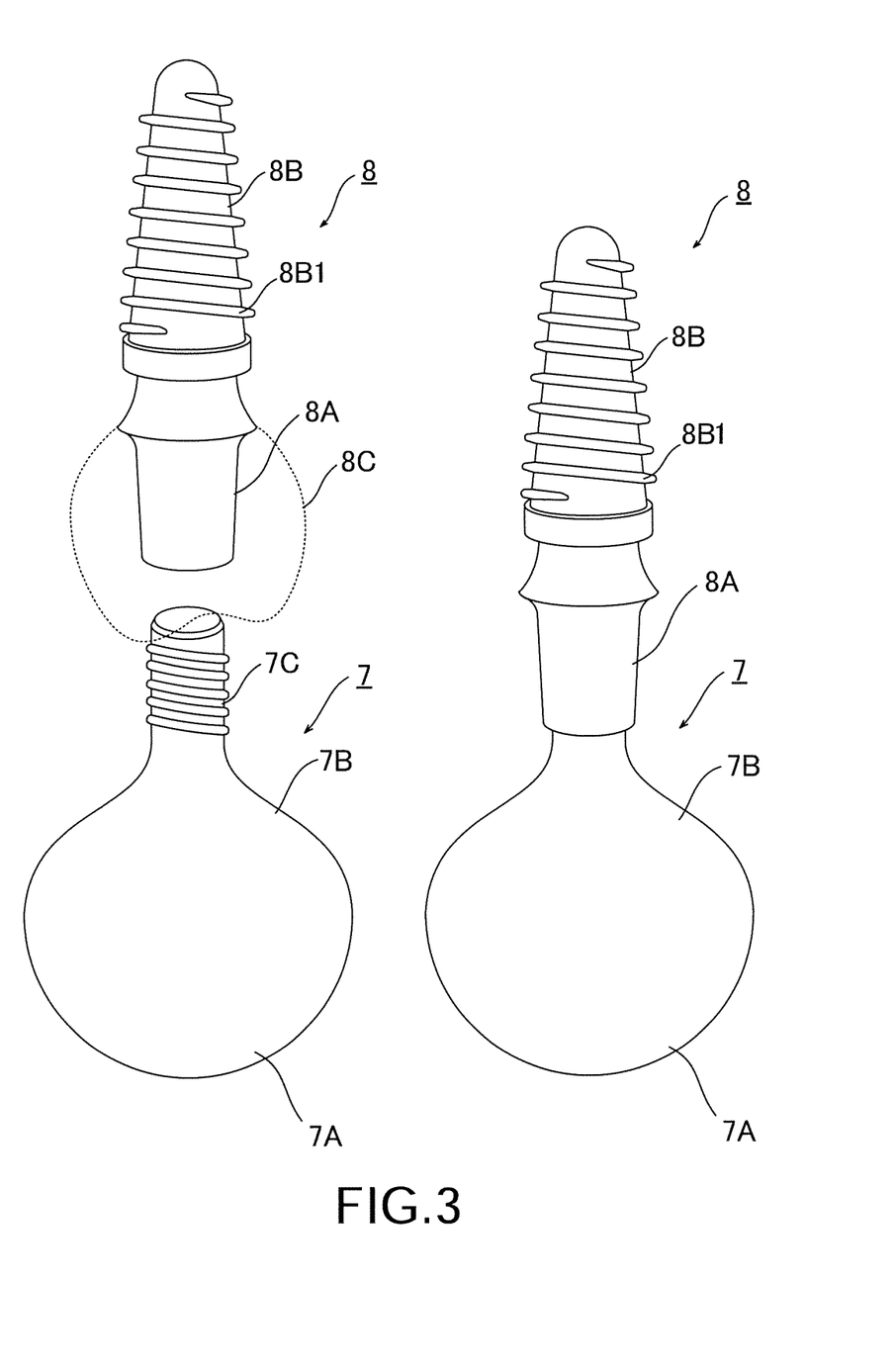
FIG. 3 is a three-dimensional side view showing an embodiment of a holding jig.

The holding jigs 7 are auxiliary means for holding the implants 8 and tilting the implants 8 in cooperation with the movable holding base 6A and the stationary pushing plate 6B. As shown in FIG. 3, each of the holding jigs 7 includes a lower part 7A, an upper part 7B, and a protrusion part 7C. The holding jig 7 is provided with male threads formed on the outer surface of the cylindrical protrusion part 7C. The implants 8 are dental implants (artificial dental roots), and each include a base part 8A and a dental root part 8B. The base part 8A has a cylindrical hollow space formed therein (not shown), and is provided with female threads formed on the inner surface of the hollow space. The dental root part 8B is provided, on the outer surface thereof, with threaded portions 8B1 that are screwed into a jawbone in order to screw and fix the implant 8 into the jawbone.

The holding jig 7 holds the implant 8 in such a manner as to turn over the implant 8 and threadedly engage the female threads of the base part 8A with the male threads of the protrusion part 7C. For example, the implant 8 can be held on the holding jig 7 by simply inserting the implant 8 over the protrusion part 7C of the holding jig 7 or by threadedly fastening the implant 8. There is no limitation on a method for holding the implant 8 as long as the implant 8 is not separated from the holding jig 7 when the holding jig 7 is tilted.

As shown in FIGS. 1, 2 and 4, the holding jigs 7 with the implants 8 held thereon are disposed such that the implants 8 extend through the through holes 60B of the stationary pushing plate 6B and are positioned perpendicular to the receiving depressions 60A of the movable holding base 6. After all the implants 8 have been vertically positioned in the respective receiving depressions 60A of the movable holding base 6A, the stationary pushing plate 6B is lowered from the above, and is held at a predetermined height.

As shown in FIG. 3, the lower part 7A of the holding jig 7 has a curved surface. Meanwhile, the upper part 7B of the holding jig 7 has a smooth curved surface or an inclined surface such that the holding jig 7 is rotated and tilted about the center O of the holding jig 7 without being caught on the contact surface thereof by the stationary pushing plate 6B when the upper part 7B is covered with the stationary pushing plate 6B.

The holding jig 7 has a semispherical shape in the lower part 7A thereof, and has an approximately spherical shape in its overall form. An artificial tooth 8C, which is shown by a dotted line, is fastened to the base part 8A of the implant 8 after the dental root part 8B of thereof has been completely fixed into a jawbone and a gum.

The operation of the tilting unit 6 during the radiation of electron beams onto the implants 8 is now described in detail with reference to FIGS. 4, 5(a) and 5(b). The alternate long and short dash line arrows in FIGS. 5(a) and 5(b) schematically show electrons that are emitted from the electron gun 5A.

Figure 5A:
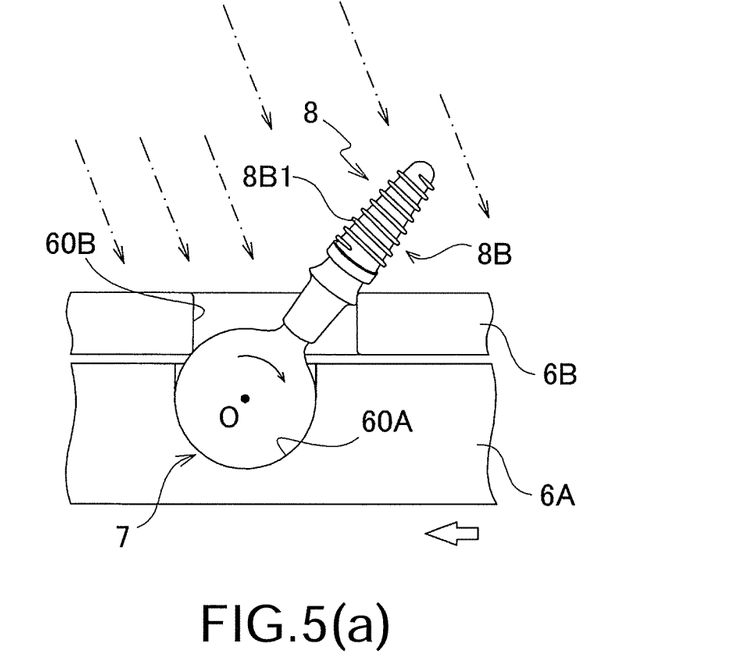
FIGS. 5(a) and 5(b) are enlarged side sectional views of the portion of the holding jig during the radiation of an electron beam.
Figure 5B:
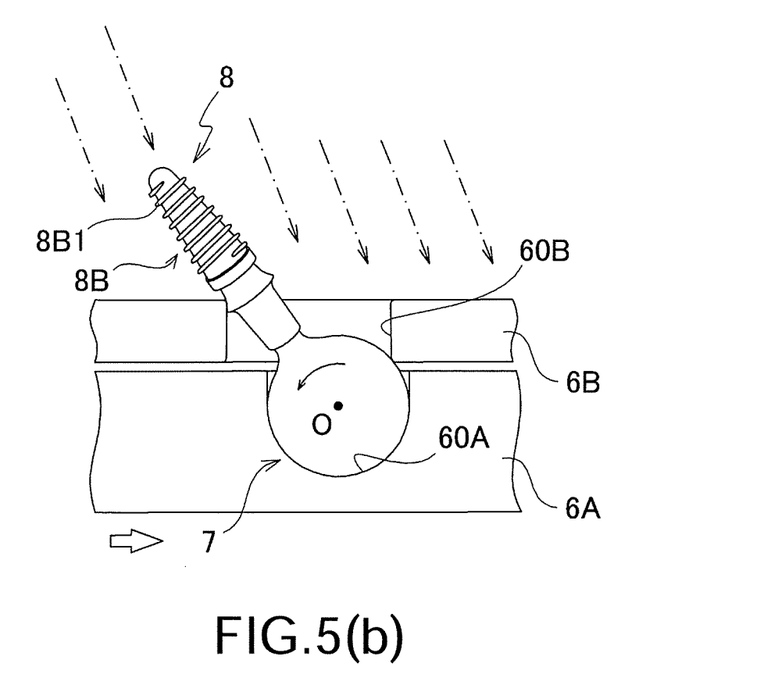

When the movable holding base 6A is moved leftward as shown in FIG. 5(a) in the state in which the implant 8 is mounted such that the axial direction of the implant 8 coincides with a vertical direction as shown in FIG. 4, the movable holding base 6A and the stationary pushing plate 6B are moved in relative to each other, and thus the holding jig 7 comes into contact with the left inner surface of the through hole 60B of the stationary pushing plate 6B. Meanwhile, when the movable holding base 6A is moved leftward, a rightward force is applied to the portion of the holding jig 7 that is in contact with the stationary pushing plate 6B. Since the receiving depression 60A has the curved surface corresponding to the curved surface of the lower part 7A of the holding jig 7, the holding jig 7 receives the rightward force on the portion thereof above the center O, and is thus rotated clockwise about the center O while the lower part 7A of the holding jig 7 is sliding along the curved surface of the receiving depression 60A. As the holding jig 7 is rotated, the axis of the implant 8 mounted on the holding jig 7 is rotated clockwise and tilted about the center O of the holding jig 7, which serves as a center of rotation. The axis of the implant 8 is further tilted until it comes into contact with the right inner surface of the through hole 60B of the stationary pushing plate 6B.

In other words, the inclined angle of the axis of the implant 8 is dependent upon the size of the through hole 60B. More specifically, when the through hole 60B has a large size, the distance through which the stationary pushing plate 6B can move relative to the movable holding base 6A is increased. Accordingly, the rotation of the holding jig 7 is increased, and thus the axis of the implant 8 mounted on the holding jig 7 is tilted to a large angle with respect to the vertical line. Meanwhile, when the through hole 60B has a small size, the distance through which the stationary pushing plate 6B can move relative to the movable holding base 6A is decreased. Accordingly, the rotation of the holding jig 7 is decreased, and thus the axis of the implant 8 mounted on the holding jig 7 is tilted to a small angle with respect to the vertical line. Therefore, the axis of the implant 8 is tilted to an angle equal to or smaller than a right angle with respect to the vertical line.

Since an electron beam is radiated onto the implant 8 in the state in which the axis of the implant 8 is sufficiently tilted with respect to the vertical line, it is possible to radiate an electron beam even onto the lower shaded portions of the thread crests 8B1. Furthermore, by designing the size of the through holes 60B such that the axes of the implants 8 have a desired inclined angle, it is made possible to easily and uniformly control the inclined angles of the axes of the plurality of implants 8 mounted on the tilting unit 6.

As shown in FIG. 5(b), the direction in which the implant 8 is inclined is changed. More specifically, when the movable holding base 6A is moved rightward, the holding jig 7 comes into contact with the right inner surface of the through hole 60B of the stationary pushing plate 6B. When the movable holding base 6A is further moved rightward, the holding jig 7 is pushed leftward by the stationary pushing plate 6B, and is thus rotated counterclockwise. As the holding jig 7 is rotated, the axis of the implant 8 mounted on the holding jig 7 is rotated and tilted counterclockwise about the center O of the holding jig 7. The axis of the implant 8 is tilted until it comes into contact with the left inner surface of the through hole 60B of the stationary pushing plate 6B.

In this way, by radiating electron beams onto the implants 8 while the direction in which the implants 8 are inclined is being repeatedly changed by the horizontal movement of the movable holding base 6A, it is made possible to radiate electron beams onto the overall surfaces of the implants 8. Therefore, it is possible to reliably modify the overall surfaces of the plurality of implants 8 at one time.

Although the preferred embodiment of the present invention has been described above, the present invention is not limited thereto, and various design changes may be made within the scope of the attached claims.

Although the axes of the plurality of implants 8 have been described as being uniformly tilted in the present embodiment, the axes of the plurality of implants 8 may have different inclined angles. As described above, by radiating electron beams onto the plurality of implants 8 while the inclined direction of the implants 8 is being repeatedly changed, it is made possible to reliably modify the overall surfaces of the plurality of implants 8 at one time.

What is claimed is:

1. A metal surface modification apparatus for modifying surfaces of titanium implants made of a titanium alloy, the metal surface modification apparatus comprising:
  a vacuum chamber configured to accommodate the implants in a vacuum environment;
  a transfer unit disposed within the vacuum chamber, and configured to move the implants at least in a first horizontal uniaxial direction and in a second horizontal uniaxial direction perpendicular to the first horizontal uniaxial direction;
  a table disposed on the transfer unit, and configured such that the implants are placed thereon;
  an electron gun including a cathode electrode, an annular anode electrode configured to generate plasma, and a solenoid configured to generate a magnetic field; and
  a tilting unit configured to tilt the implants to a predetermined angle as the transfer unit moves the implants;
  wherein the tilting unit further comprises:
  a plurality of holding jigs configured to have a plurality of respective lower parts having curved surfaces, respectively, and to hold the implants, respectively;
  a movable holding base fastened onto the table, and configured to have a plurality of receiving depressions formed through an upper surface thereof to have curved surfaces corresponding to the curved surfaces of the lower parts of the holding jigs; and
  a stationary pushing plate disposed on the movable holding base to cover the movable holding base, and configured to be moved relative to the movable holding base and to have a plurality of through holes positioned to face the receiving depressions.

* * * * *